(12) United States Patent
Briar

(10) Patent No.: US 6,660,565 B1
(45) Date of Patent: Dec. 9, 2003

(54) FLIP CHIP MOLDED/EXPOSED DIE PROCESS AND PACKAGE STRUCTURE

(75) Inventor: John Briar, Singapore (SG)

(73) Assignee: St Assembly Test Services Pte Ltd., Singapore (SG)

(*) Notice: Subject to any disclaimer, the term of this patent is extended or adjusted under 35 U.S.C. 154(b) by 25 days.

(21) Appl. No.: 09/640,534

(22) Filed: Aug. 17, 2000

(51) Int. Cl.[7] .................. H01L 21/44; H01L 21/48; H01L 21/50
(52) U.S. Cl. ........................... 438/122; 438/118
(58) Field of Search .................. 438/106–108, 438/118, 122, 126, 127, 112, 124; 361/734, 268, 271; 257/778, 276, 675, 706, 796; 439/66

(56) References Cited

U.S. PATENT DOCUMENTS

| | | | |
|---|---|---|---|
| 5,385,869 A | 1/1995 | Liu et al. ............... | 437/209 |
| 5,726,079 A | 3/1998 | Johnson ............... | 438/106 |
| 5,817,545 A | 10/1998 | Wang et al. ............ | 438/127 |
| 5,883,430 A | 3/1999 | Johnson ............... | 257/706 |
| 5,896,271 A | 4/1999 | Jensen et al. .......... | 361/719 |
| 5,898,224 A | 4/1999 | Akram ................ | 257/778 |
| 5,909,056 A | * 6/1999 | Mertol ................ | 257/704 |
| 5,990,418 A | * 11/1999 | Bivona et al. ......... | 174/52.4 |
| 6,117,797 A | * 9/2000 | Hembree .............. | 438/759 |
| 6,309,908 B1 | * 10/2001 | Sarihan et al. ......... | 438/106 |
| 6,468,832 B1 | * 10/2002 | Mostafazadeh .......... | 438/112 |
| 2002/0070445 A1 | * 6/2002 | Tarter ................ | 257/714 |

* cited by examiner

Primary Examiner—Tom Thomas
Assistant Examiner—Douglas W. Owens
(74) Attorney, Agent, or Firm—George O. Saile; Stephen B. Ackerman

(57) ABSTRACT

In accordance with the objectives of the invention a new method is provided to insert the underfill for flip-chip semiconductor devices. An IC chip is provided with solder bumps. The flip-chip is entered into an enclosed space, the heatsink forms the top of the enclosed space, the substrate forms the bottom of the enclosed space. The enclosed space is filled with a mold compound. This mold compound now surrounds the IC chip thereby including the area below the IC. The step of inserting the underfill as a separate processing step has thereby been eliminated.

12 Claims, 2 Drawing Sheets

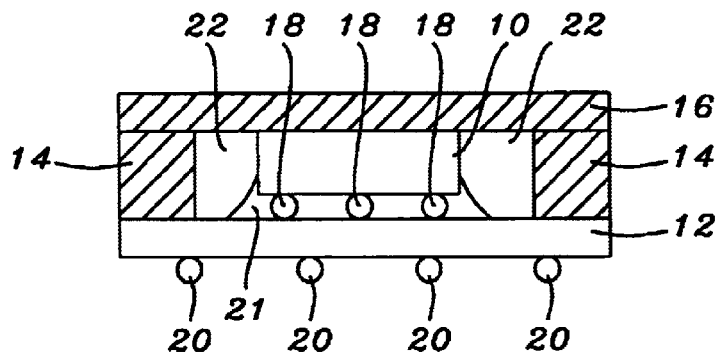
FIG. 1 – Prior Art
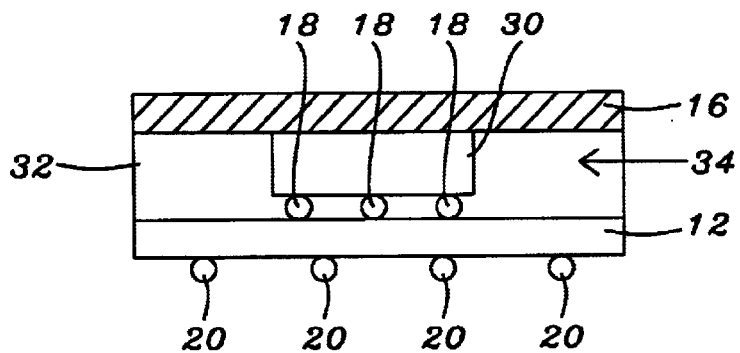
FIG. 2
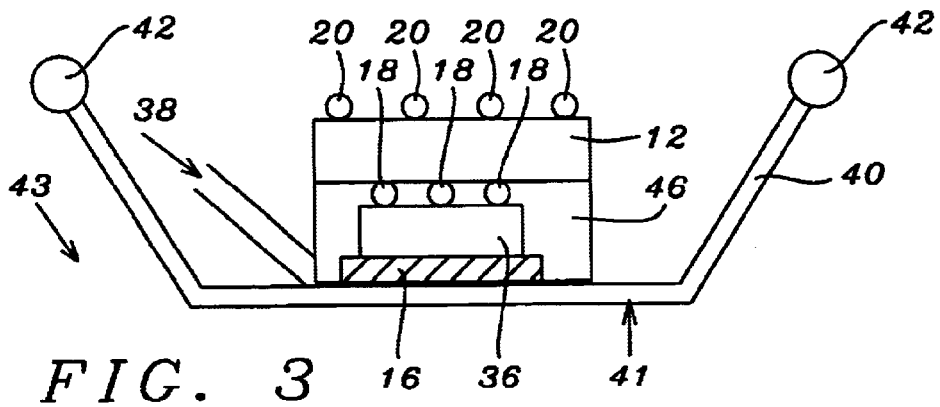
FIG. 3

FLIP CHIP MOLDED/EXPOSED DIE PROCESS AND PACKAGE STRUCTURE

BACKGROUND OF THE INVENTION

(1) Field of the Invention

The invention relates to the fabrication of integrated circuit devices, and more particularly, to a method of creating a molded package structure for flip chips using a one step mold compound injection process.

(2) Description of the Prior Art

High density interconnect technology frequently leads to the fabrication of multilayer structures in order to connect closely spaced integrated circuits with each other. A single substrate serves as an interconnect medium to which multiple chips are connected, forming a device package with high packaging density and dense chip wiring. The metal layers that make up the interconnect network and the via and contact points that establish connections between the interconnect networks are separated by layers of dielectric (such as polyimide) or insulating layers. In the design of the metal interconnects, strict rules must be adhered to in order to avoid problems of package performance and reliability. For instance, the propagation directions of primary signals must typically intersect under angles of 90 degrees to avoid electrical interference between adjacent lines. It is further required that, for considerations of photolithography and package reliability, planarity is maintained throughout the construction of multi-layer chip packages. Many of the patterned layers within an interconnect network form the base for subsequent layers, their lack of planarity can therefore have a multiplying effect of poor planarity on overlying layers.

Quad Flat Packages (QFP) have in the past been used to create surface mounted, high pin count integrated packages with various pin configurations. The electrical connections with these packages are typically established by closely spaced leads that are distributed along the four edges of the flat package. This limits the usefulness of the QFP since a high I/O count cannot be accommodated in this manner. To address this problem, the Ball Grid Array (BGA) package has been created whereby the I/O points for the package are distributed not only around the periphery of the package but over the complete bottom of the package. The BGA package can therefore support more I/O points, making this a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

Where circuit density keeps increasing and device feature size continues to be reduced, the effect of the interconnect metal. within the package becomes relatively more important to the package performance. Factors that have a negative impact on circuit performance, such as line resistance, parasitic capacitance, RC-delay constants, crosstalk and contact resistance, have a considerable impact on the package design and its limitations. A significant power drop may for instance be introduced along the power and ground buses where the reduction of the interconnect metal does not match the reduction in the size of the device features. Low resistance metals (such as copper) are therefore finding wider application in the design of dense semiconductor packages.

Increased input/output (I/O) requirements combined with increased performance requirements for high performance Integrated Circuits (IC's) has led to the development of Flip Chip packages. Flip chip technology fabricates bumps (typically Pb/Sn solder) on Al pads and interconnects the bumps directly to the package media, which are usually ceramic or plastic based. The flip-chip is bonded face down to the package through the shortest paths. These technologies can be applied not only to single-chip packaging, but also to higher or integrated levels of packaging, in which the packages are larger, and to more sophisticated package media that accommodate several chips to form larger functional units.

The flip-chip technique, using an area array, has the advantage of achieving the highest density of interconnection to the device combined with a very low inductance interconnection to the package. However, pre-testability, post-bonding visual inspection, and Temperature Coefficient of Expansion (TCE) matching to avoid solder bump fatigue are still challenges. In mounting several packages together, such as surface mounting a ceramic package to a plastic board, the TCE mismatch can cause a large thermal stress on the solder lead joints that can lead to joint breakage caused by solder fatigue from temperature cycling operations.

Prior Art substrate packaging uses ceramic and plastic Ball Grid Array (BGA) packaging. Ceramic substrate packaging is expensive and has proven to limit the performance of the overall package. Recent years have seen the emergence of plastic BGA packaging, this packaging has become the mainstream design and is frequently used in high volume BGA package fabrication. The plastic substrate BGA package performs satisfactorily when used for low-density flip-chip IC's. If the number of pins emanating from the IC is high, that is in excess of 350 pins, or if the number of pins coming from the IC is less than 350 but the required overall package size is small, or if the chip power dissipation is high (in excess of 4 Watts per chip), the plastic structure becomes complicated and expensive.

It is therefore the objective of packaging ball grid array and flip-chip packages that the chip is mounted on the surface of a package substrate. The contact points of the flip-chip Integrated Circuit (IC) device make contact with contact points in the top surface of the Ball Grid Array (BGA) substrate, the substrate re-distributes (fan-out) the flip-chip IC contact points. The lower surface of the substrate has the contact point (balls) that are connected to the surrounding circuitry and that form the interface between the BGA/flip-chip IC contact balls and this surrounding circuitry. It must thereby also be understood that the original contact balls of the flip chip IC device are encased in a material (for instance epoxy) for protection of these balls. The epoxy is encased between the lower surface of the flip-chip IC device and the upper surface of the BGA substrate. This epoxy layer is referred to as underfill since it is filled in under the flip-chip device. The underfill is normally put in place using a separate process of dispensing epoxy liquid under the die followed by curing of the epoxy. IC devices that are packaged using a flip chip and that have requirements of high power dissipation normally require a heatsink that is attached to the surface of the flip chip die. Only the backside of the flip chip is exposed and is suitable for the attachment of the heatsink. Since the heatsink is only attached to the (backside) surface of the IC device, great care must be taken not to induce stress on the backside of the IC device. If too much force or stress is used during the process of attaching the heatsink to the die, the die can easily crack or break. If on the other hand a larger surface area is created that is parallel to the surface of the backside of the IC device, the stress can be significantly reduced.

FIG. 1 shows a cross section of a typical flip chip package with underfill and a heatsink. The IC 10 enters the process as a separate unit with the contact points (balls 18) attached to the bottom of the chip 10. The IC 10 is placed in a cavity 22 that is formed by the spacers 14 between the heatsink 16 and the substrate 12. While the chip 10 is contained in cavity 22, the underfill 21 under the surface of the IC chip 10 is injected or filled by capillary action. The balls 20 connected to the lower surface of the substrate 12 make contact with the surrounding circuitry. It should be noted in FIG. 1 that the sides of the underfill 21 are sloping such that the physical contact between the underfill 21 and the substrate 12 is extended beyond the dimensions of the bottom surface of the chip 10. This is a normal phenomenon with liquid underfill, which enhances heat interchange between the substrate 12 and the IC chip 10.

U.S. Pat. No. 5,898,224 (Akram) shows a Flip chip assembly with underlayer and a heatsink and an outer top encapsulant.

U.S. Pat. No. 5,726,079 (Johnson) and U.S. Pat. No, 5,883,430 (Johnson) show a flip chip encapulated on the bottom and sides, a heatsink on top and an underlayer.

U.S. Pat. No. 5,817,545 (Wang et al.) teaches a process for underfill for a flip chip.

U.S. Pat. No. 5,896,271 (Jensen et al.) recites a flex substrate with a heatsink on top.

U.S. Pat. No. 5,385,869 (Liu et al.) shows a flip chip and a mold process.

SUMMARY OF THE INVENTION

A principle objective of the invention is to create underfill for flip-chip type Integrated Circuits (IC's) in one processing step by forcing a mold compound to flow under the die rather than over the backside of the die.

Another objective of the invention is to relieve thermal and mechanical stress between the flip-chip die and the heatsink that is attached to the die by creating a uniform flat surface as an interface between the die and the heatsink. This uniform flat surface distributes the stress that is introduced by the attachment of the heatsink over a larger area, thereby reducing the stress to which the die is subjected (during heatsink attachment).

In accordance with the objectives of the invention a new method is provided to insert the underfill for flip-chip semiconductor devices. An IC chip is provided with solder bumps. The flip-chip is entered into an enclosed space, the heatsink forms the top of the enclosed space, the substrate forms the bottom of the enclosed space. The enclosed space is filled with a mold compound. This mold compound now surrounds the IC chip thereby including the area below the IC. The step of inserting the underfill as a separate processing step has thereby been eliminated.

BRIEF DESCRIPTION OF THE DRAWINGS

FIG. 1 shows the Prior Art method of providing for a flip-chip underfill.

FIG. 2 shows the method of the invention for providing for a flip-chip underfill.

FIG. 3 shows how the underfill of the invention can be provided in a manufacturing environment.

DESCRIPTION OF THE PREFERRED EMBODIMENTS

Figure 4A:
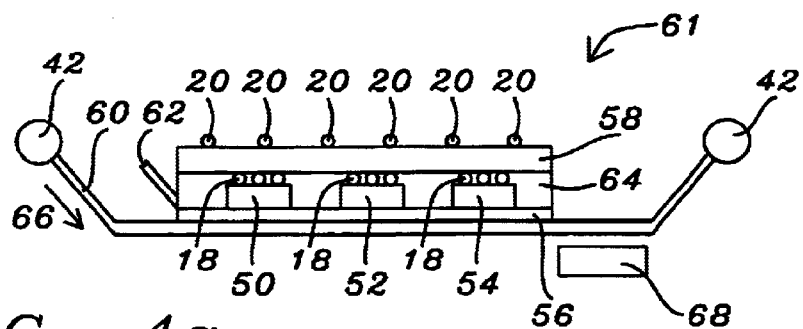
FIGS. 4a through 4c shows how more than one flip-chip can be treated at one time in accordance with the invention.

Referring now specifically to FIG. 2, there is shown a cross section of the process of providing a flip-chip with an underfill in one processing step. The flip-chip 30 is mounted inside the cavity 32 and between the heatsink 16 and the substrate 12 as shown. A mold compound 34 is now injected into the cavity 32 thereby filling the areas around the flip-chip 30, including the areas underneath the flip chip. The flip-chip is in this manner encased in one processing step whereby the encasing makes contact with the heatsink 16 and the substrate 12 while also providing the underfill. The flip-chip contact balls 18 and the substrate contact balls 20 remain in place as under Prior Art processing steps and perform the same circuit functions as highlighted above.

The total package that has been created in this manner contains the IC chip 30 with its contact balls 18, a mold compound 34 that surrounds the IC chip 30 while providing the underfill for the IC chip 30, a heatsink 16 and a substrate 12 with its contact balls 20. Substrate 12 is provided with a network of interconnect lines that interconnects the substrate upper surface contact points with the substrate lower surface contact points, this network to be contained in one or more planes within the substrate. Cavity 32 is created by creating four planer spacers that separate the heatsink from the substrate by a measurable amount, this amount to be selected such that contact points of the IC device make contact with the substrate upper surface contact points while a upper surface of the IC device makes contact with the heatsink.

From the cross section that is shown in FIG. 2 it is clear that:

by forming the cavity 32 into which the mold compound 34 is injected, the upper surface of the flip chip 30 is firmly pressed against the surface of the heatsink 16, forcing in the mold compound 34 that is injected into the cavity 32 under the flip chip 30 and between the contact balls 18, and the surface of heatsink 16 (which is essentially parallel with the upper surface of the flip chip) provides firm and uniform support for the flip chip 30, eliminating localized areas of pressure on the flip chip 30 and eliminating the potential for damage to the flip chip 30 at the time that the flip chip 30 is attached to the heatsink 16.

FIG. 3 shows a method that can be used to implement the encasing of the flip-chip in accordance with the invention. The heatsink 16 can be attached (by adhesion) to a flexible tape 40. The flexible tape 40 can be put into motion to move or position the flip-chip 36 to a processing station for the mold injection by means of the rotary motors 42. The flip-chip 36 is placed on top of the heatsink 16 with its contact points (balls) 18 facing upwards. The substrate 12 is placed on top of the contact points 18 such that the contact points (balls) 20 of the substrate, 12 also face in an upwards direction. When the package of heatsink 16, flip-chip 36 and substrate 12 reaches the mold injection processing station, mold 38 is entered into the cavity 46 between the heatsink 16 and the substrate 12. The mold 38 will fill the complete cavity 46, encapsulating the flip-chip 36 including the area directly between the bottom of the flip-chip 36 and the top of the substrate 12 (the underfill). As a separate embodiment of the invention, the process as indicated can be performed without the use of a heatsink. This for applications and designs of flip-chips where a heatsink is not required. With the flip-chip traveling in direction 43, the mold 38 that has been injected into the cavity 46 can be treated and cured by UV exposure at station 41.

The advantages that apply to the method shown in cross section in FIG. 2 equally apply to the method shown in cross section on FIG. 3, that is forcing the mold compound under the flip chip and having a uniform, stress free interface between the flip chip 36 and the heatsink 16.

It is clear that, where FIG. 3 shows the creation of a package for one flip chip, this concept can readily be extended to include the creation of multiple chip packages in one step of mold injection. By extending the length of the cavity 46 such that a multiplicity of flip chips can be fitted inside that created cavity, packages for this multiplicity of flip chips can be created. This concept is further highlighted under the following FIGS. 4a through 4c.

Figure 4B:
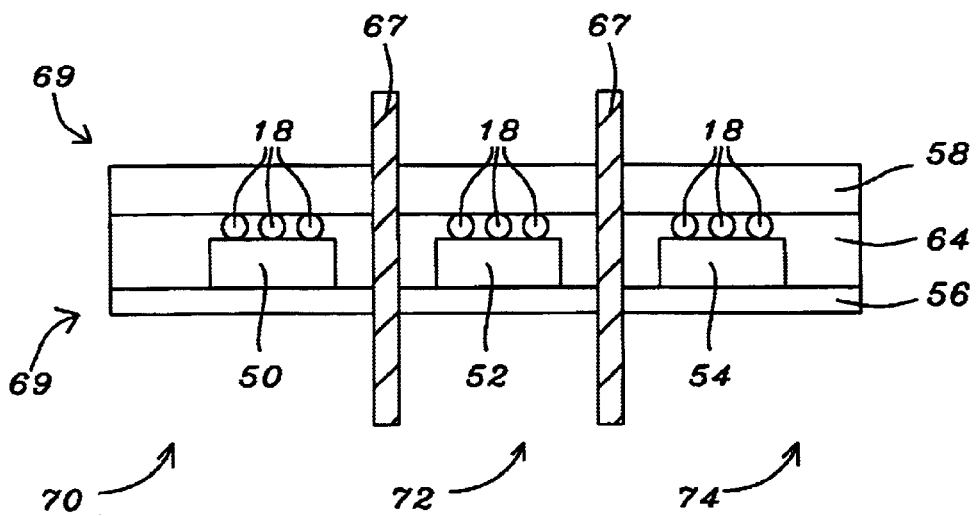
Figure 4C:
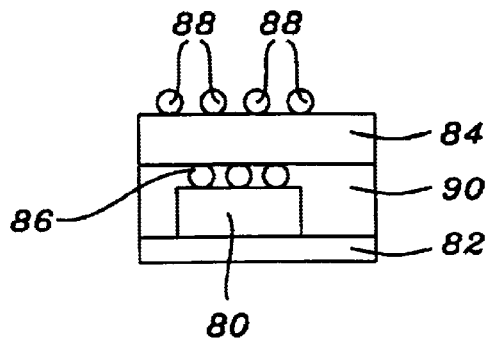

FIGS. 4a through 4c show how more than one flip-chip can be treated in accordance with the invention.

For the example shown in FIG. 4a, three flip chips (50, 52 and 54) have been mounted in the manner previously described under FIG. 3. A relatively large cavity 64 is in this manner formed between the heatsink 56 and the substrate 58. The arrangement of multiple chips can again be transported to a mold injection station by means of a flexible tape 60. When the cavity 64 has been aligned in the proper position (with respect to the injection of mold compound 62), the mold compound 62 can be injected into cavity 64, surrounding all flip-chips that are contained within the cavity (here: 50, 52 and 54) with the mold compound 62. If the flip-chips travel in direction 66, the mold compound 62 that surrounds the flip-chip after injection can be treated and cured by UV exposure at station 68. Cavity 64 is a cavity for the second assembly 61, this cavity 64 to comprise planes that are bordered by the heatsink 56 and the IC substrate 58 and that additionally intersect the first surface of the heatsink 56 and the first surface of the IC substrate 58 under an angle, the cavity further 64 enclosing at least one Integrated Circuit device, the cavity 64 further having been provided with an opening through which a molding compound 62 can be injected.

It must again be emphasized that the advantages that applied to the method that has been shown in cross section in FIG. 2 equally apply to the method shown in cross section on FIG. 4a, that is forcing the mold compound under the flip chips 50, 52 and 54 and having a uniform, stress free interface between the flip chips 50, 52 and 54 and the heatsink 56.

FIG. 4b shows how the completed package 69 of multiple flip-chips encased in the mold can be separated into separate flip-chip packages. It will be recognized that the package 69 that is shown in FIG. 4b is the same package that was transported across the flexible tape 60 in FIG. 4a. A scorching or milling operation 67 will subdivide the multiple flip-chip package 70 into individual flip-chip packages 70, 72 and 74.

FIG. 4c shows one of the flip-chip packages that has been created in accordance with the invention. The IC chip 80 with its contact balls 86 is in contact with heatsink 82. The contact balls 86 of the IC chip 80 are in contact with the substrate 84 that is provided with contact balls 88. The IC chip 80 is encased in a mold compound 90, the mold compound 90 is also present between the IC chip 80 and the substrate 84 thereby forming the underfill for the IC chip 80.

It will be recognized that the method of the invention has eliminated one step (the separate step of providing the underfill) from the conventional method of creating the flip-chip package.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of packaging Integrated Circuit devices, comprising:

providing an Integrated Circuit device having first contact balls over a bottom surface in addition to having a top surface;

providing a heatsink for said Integrated Circuit device, a first surface of said heatsink being attached by adhesion to a flexible tape;

providing a substrate on which to mount said Integrated Circuit device, said substrate having second contact balls over a bottom surface in addition to having a top surface;

placing the IC device on top of the heatsink by bringing said top surface of said IC device in contact with a second surface of said heatsink, facing said first contact balls in an upward direction;

placing said substrate on top of the first contact balls, facing said second contact balls in an upward direction, thereby;

creating an enclosed space surrounding said Integrated Circuit device, two surfaces of said enclosed space comprising said first surface of said heatsink and said top surface of said substrate;

providing forward motion to said flexible tape, thereby moving the IC device to a processing station for mold injection, said forward motion being provided by means of rotary motors; and filling the enclosed space around said Integrated Circuit device, including areas underneath the Integrated Circuit device, by injecting a mold compound into said enclosed space, thereby pressing said Integrated Circuit device firmly against a surface of said heatsink, said mold completely filling the enclosed space, thereby encapsulating the IC device including areas between the bottom of the IC device and the top of the substrate, forming an underfill for the IC device.

2. The method of claim 1 wherein said Integrated Circuit (IC) device has a top surface and a bottom surface, wherein contact points of said IC device are mounted in said bottom surface of said device.

3. The method of claim 1 wherein said Integrated Circuit device is selected from a group comprising Ball Grid Array (BGA), Land Grid Array (LGA) and Pin Grid Array (PGA), Chip Scale Packaging (CSP) and Quad Flat Pack (QFP) devices.

4. The method of claim 1 wherein said providing a substrate is providing a means for connecting contact points of said IC device with surrounding electrical circuitry.

5. The method of claim 1 wherein said substrate comprises;

an upper surface;

electrical contact points provided in said upper surface, forming upper surface contact points, provided to make electrical contact with contact points of said IC device;

a lower surface;

electrical contact points provided in said lower surface, forming lower surface contact points, provided to make electrical contact with surrounding electrical circuitry of which said IC device is a functional component; and a network of conducting interconnect lines that interconnects said upper surface contact points with said lower surface contact points, said network to be contained in one or more planes within said substrate.

6. The method of claim 1 wherein said creating an enclosed space comprises:

placing said heatsink in a plane parallel to a plane of said substrate;

creating four spacers separating said heatsink from said substrate by a distance, said distance being selected such that contact points of said IC device make contact with substrate upper contact points while an upper surface of said IC device makes contact with said heatsink, said four spacers being provided with ability to pass a mold compound there-through into a cavity enclosed by said four spacers, said heatsink and said substrate; and forming an enclosed space, the heatsink and the substrate forming opposite walls of said enclosed space, said four planer spacers forming two sets of two opposing walls of said enclosed space, two walls that make up each of these sets of opposing walls being parallel and having identical geometric dimensions, a surface of said heatsink being parallel with a plane of said substrate.

7. The method of claim 1 wherein said creating an enclosed space is creating an enclosed space of a size such that one or more IC devices can simultaneously be fitted inside said an enclosed space, creating a enclosed space that contains one or more IC devices.

8. The method of claim 7 wherein an enclosed space that contains more than one IC device is separated into one or more enclosed spaces that contain one or more IC devices.

9. The method of claim 1 with the additional step of positioning said inserted Integrated Circuit device with the enclosed space into which it has been inserted into a mold injection station under control of automatic transport of said IC device.

10. The method of claim 1 with the additional step of exposing said IC device to UV light, curing said mold compound.

11. The method of claim 1 whereby said heatsink is replaced by a surface of geometric dimensions that are equal to geometric dimensions of said substrate.

12. A method of packaging an Integrated Circuit (IC) device, comprising:

providing an Integrated Circuit (IC) device having a flat first surface on which no points of input/output connect are provided for said IC device, having a flat second surface on which points of input/output connect comprising solder bumps or contact balls or contact pads are provided for said IC device;

providing a heatsink having a flat first surface, further having a flat second surface, said second surface of said heatsink being attached by adhesion to a flexible tape;

mounting said IC device on the first surface of said heatsink by joining said first surface of said IC device with said first surface of said heatsink, creating a first assembly;

providing an IC substrate having a flat first surface, points of electrical interconnect comprising contact pads or via openings have been provided in or on said first surface, further having a second surface, points of electrical interconnect comprising solder bumps or contact balls or contact pads have been provided in or on said second surface;

mounting said first assembly on said IC substrate by joining said solder bumps or contact balls or contact pads provided in or on said second surface of said IC device with said points of electrical interconnect provided in said first surface of said IC substrate, creating a second assembly;

providing an enclosed space for said second assembly, said enclosed space enclosing said Integrated Circuit device, said enclosed space further having been provided with an opening through which a mold compound can be injected;

providing forward motion to said flexible tape, thereby moving the second assembly to a processing station for mold injection, said forward motion being provided by means of rotary motors; and filling the enclosed space around said Integrated Circuit device, including the areas underneath the Integrated Circuit device, by injecting said mold compound into said enclosed space, thereby pressing said Integrated Circuit device firmly against a surface of said heatsink.

* * * * *